(12) United States Patent
Grebennikov et al.

(10) Patent No.: US 10,797,653 B2
(45) Date of Patent: Oct. 6, 2020

(54) CONSECUTIVE DOHERTY AMPLIFIER

(71) Applicant: SUMITOMO ELECTRIC DEVICE INNOVATIONS, INC., Yokohama-shi, Kanagawa (JP)

(72) Inventors: Andrey Grebennikov, Herts (GB); James Wong, Surrey (GB); Naoki Watanabe, London (GB)

(73) Assignee: Sumitomo Electric Device Innovations, Inc., Yokohama-shi (JP)

( * ) Notice: Subject to any disclaimer, the term of this patent is extended or adjusted under 35 U.S.C. 154(b) by 0 days.

(21) Appl. No.: 16/263,307

(22) Filed: Jan. 31, 2019

(65) Prior Publication Data
US 2019/0238096 A1    Aug. 1, 2019

Related U.S. Application Data

(60) Provisional application No. 62/624,389, filed on Jan. 31, 2018, provisional application No. 62/624,398, filed on Jan. 31, 2018, provisional application No. 62/624,403, filed on Jan. 31, 2018.

(51) Int. Cl.
| | |
|---|---|
| *H03F 1/02* | (2006.01) |
| *H03F 1/56* | (2006.01) |
| *H03F 3/60* | (2006.01) |
| *H03F 3/21* | (2006.01) |
| *H03F 3/24* | (2006.01) |

(52) U.S. Cl.
CPC ......... *H03F 1/0288* (2013.01); *H03F 1/0261* (2013.01); *H03F 1/56* (2013.01); *H03F 3/21* (2013.01); *H03F 3/245* (2013.01); *H03F 3/607* (2013.01); *H03F 2200/408* (2013.01); *H03F 2200/451* (2013.01)

(58) Field of Classification Search
USPC .................. 330/295, 124 R, 84, 286, 53–54
See application file for complete search history.

(56) References Cited

U.S. PATENT DOCUMENTS

| | | | |
|---|---|---|---|
| 2,210,028 A | 8/1940 | Doherty | |
| 9,837,966 B1* | 12/2017 | Ahmed | ................. H03F 1/0288 |
| 2010/0315162 A1 | 12/2010 | Gajadharsing et al. | |
| 2018/0254748 A1 | 9/2018 | Grebennikov et al. | |

OTHER PUBLICATIONS

Andrei Grebennikov, "A High-Efficiency 100-W Four-Stage Doherty GaN HEMT Power Amplifier Module for WCDMA Systems," IEEE MIT-S Int. Microwave Symp. Digest, 5 pages. (2011).

* cited by examiner

*Primary Examiner* — Hieu P Nguyen
(74) *Attorney, Agent, or Firm* — Baker Botts L.L.P.; Michael A. Sartori

(57) ABSTRACT

A consecutive Doherty amplifier is disclosed. The Doherty amplifier includes a carrier amplifier, a power splitter, a peak amplifier, and a phase compensator. The carrier amplifier receives a radio frequency signal with interposing any signal splitters. The power splitter splits an output of the carrier amplifier into first and second split signals. The phase compensator transfers the second split signal to the peak amplifier. The first split signal is combined with the output of the peak amplifier.

18 Claims, 12 Drawing Sheets

CONSECUTIVE DOHERTY AMPLIFIER

CROSS REFERENCE TO RELATED APPLICATION

This application claims the priority under 35 U.S.C. § 119 of U.S. Provisional Applications Ser. Nos. 62/624,389, 62/624,398, and 62/624,403, each filed on Jan. 31, 2018, the entire contents of which are relied upon and incorporated herein by references in its entirety.

BACKGROUND

1. Field of Invention

The present application relates to a Doherty amplifier.

2. Related Background Arts

Most communication systems have required that the power amplifier implemented therein is able to operate with high efficiency and high linearity simultaneously. However, a tradeoff between efficiency and linearity inevitably exists, where improvement in one of the efficiency and the linearity forces at the expense in another of the efficiency and the linearity. Besides, many wireless communications systems, such as GSM (Global System for Mobile Communications)/EDGE (Enhanced Data Rate for GSM Evolution) or WCDMA (Wideband Code Division Multiple Access)/LTE (Long Term Evolution), require that the power amplifier could deliver a wide range of output powers. As a result, when an power amplifier is designed for the highest power level with maximum available efficiency, such a power amplifier in base stations tend to operate less efficiently at lower power levels, which consumes a lot of extra dc power. Therefore, it is a real challenge to design a base station power amplifier having high efficiency and high linearity not only at maximum output power but also at lower power levels typically ranging from −6 dB and less.

SUMMARY

An aspect of the present invention relates to a consecutive Doherty amplifier that outputs an amplified signal by receiving an input radio frequency (RF) signal. The Doherty amplifier includes an input terminal, a carrier amplifier (CA), a power splitter, a peak amplifier (PA), a phase compensator, and a combining node. The input terminal receives the input RF signal thereto. The CA receives the input RF signal provided in the input terminal without interposing any signal splitters. The power splitter splits a signal output from the CA into a first split signal and a second split signal. The PA receives the second split signal. The phase compensator, which is provided between the power splitter and the PA, compensates a phase difference between the first split signal output from the power splitter and a signal output from the PA. The combining node that combines the first split signal with the signal output from the PA. A feature of the Doherty amplifier of the present invention is that the Doherty amplifier outputs the first split signal when the PA turns off, and the first split signal combined with the signal output from the PA when the PA turns on.

BRIEF DESCRIPTION OF THE DRAWINGS

The foregoing and other purposes, aspects and advantages will be better understood from the following detailed description of a preferred embodiment of the invention with reference to the drawings, in which.

DETAILED DESCRIPTION OF EMBODIMENTS

Next, some embodiment according to the present invention will be described referring to drawings. However, it will be understood that various modifications and changes may be made thereto without departing from the broader spirit and scope of the present invention. Accordingly, the present specification and drawings are to be regarded as illustrative rather than restrictive. Also, in the description of the drawings, numerals or symbols same with or similar to each other will refer to elements same with or similar to each other without overlapping explanations.

First Embodiment

Figure 1:
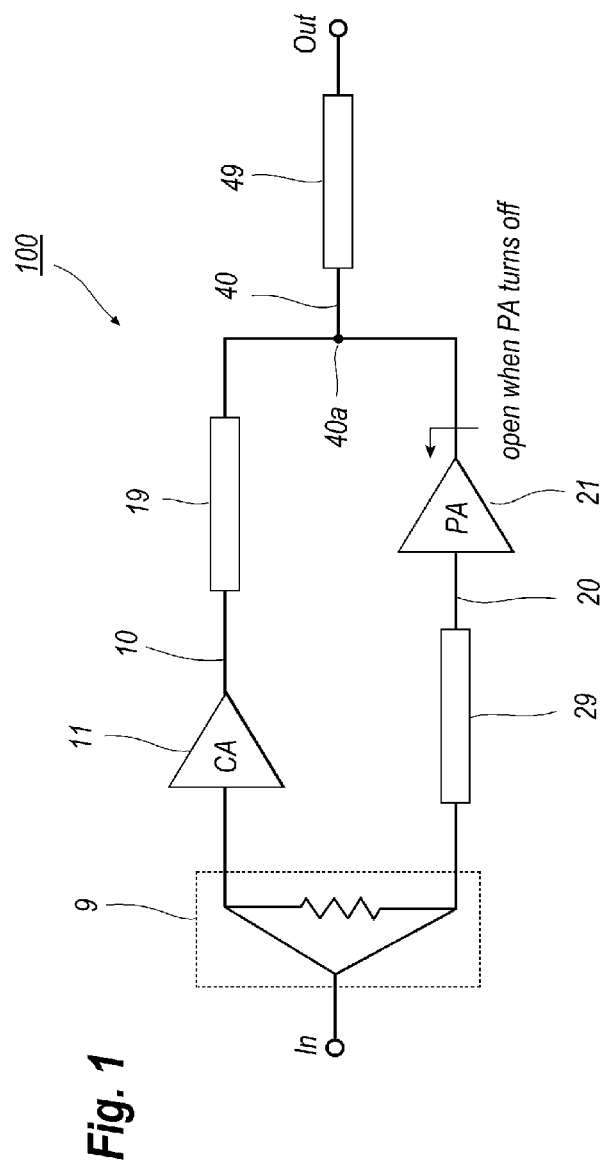
FIG. 1 schematically shows a functional block diagram of a conventional Doherty amplifier.

FIG. 1 schematically shows a functional block diagram of a conventional Doherty amplifier 100 that implements a carrier amplifier (CA) 11 and a peak amplifier (PA) 21 whose output terminal is separated by a quarter-wavelength (λ/4) transmission line 19 placed in a path 10 for the CA 11. Both the PA 21 and CA 11 may include input matching circuits and load networks each to match inherent impedance of the CA 11 and the PA 21 with impedance of 50Ω system. The input radio frequency (RF) signal provided from an external source unit to an input terminal In is evenly divided into two portions by an input splitter 9, where one of the split signal is directly provided to the CA 11; while, the other is indirectly provided to the PA 21 through another λ/4 transmission line 29. The transmission line 19 with a length of λ/4, where λ is a wavelength of the RF signal, is provided in the path 10 for the CA 11 for transforming impedance from 25Ω into 100Ω seen by the CA 11 at low output power (less than −6 dB from the saturated power) where the PA 21 is turned off. The λ/4 transmission line 29 at the input of the PA 21 is required to compensate for the 90° phase shift caused by the λ/4 transmission line 19 at the output of the CA 11. The output λ/4 line 49 with the characteristic impedance Z=√(25×50)=35.3Ω is required in the path 40 to match the standard load impedance of 50Ω provided in the output of an output terminal Out when both the CA 11 and PA 21 deliver maximum power when each of which is designed in a 50Ω system.

A conventional Doherty amplifier shown in FIG. 1 has disadvantages; one of which is, when power gain thereof drops by 3 dB at lower output power when the PA 21 is turned off because the half of the input RF signal is continuously delivered to the PA 21 by the input splitter 9 with the function of the 3 dB reduction. Another of the disadvantages is, considering parasitic drain-source capacitance of a device implemented within the PA 21 and series inductance attributed to bonding wires and lead terminals, an arrangement to provide an open circuit in the output of the PA 21 becomes hard comparing with another arrangement to provide an arrangement of a short circuit. Accordingly, a Doherty amplifier is preferably designed where the output of the PA 21 becomes the short circuit.

Figure 2:
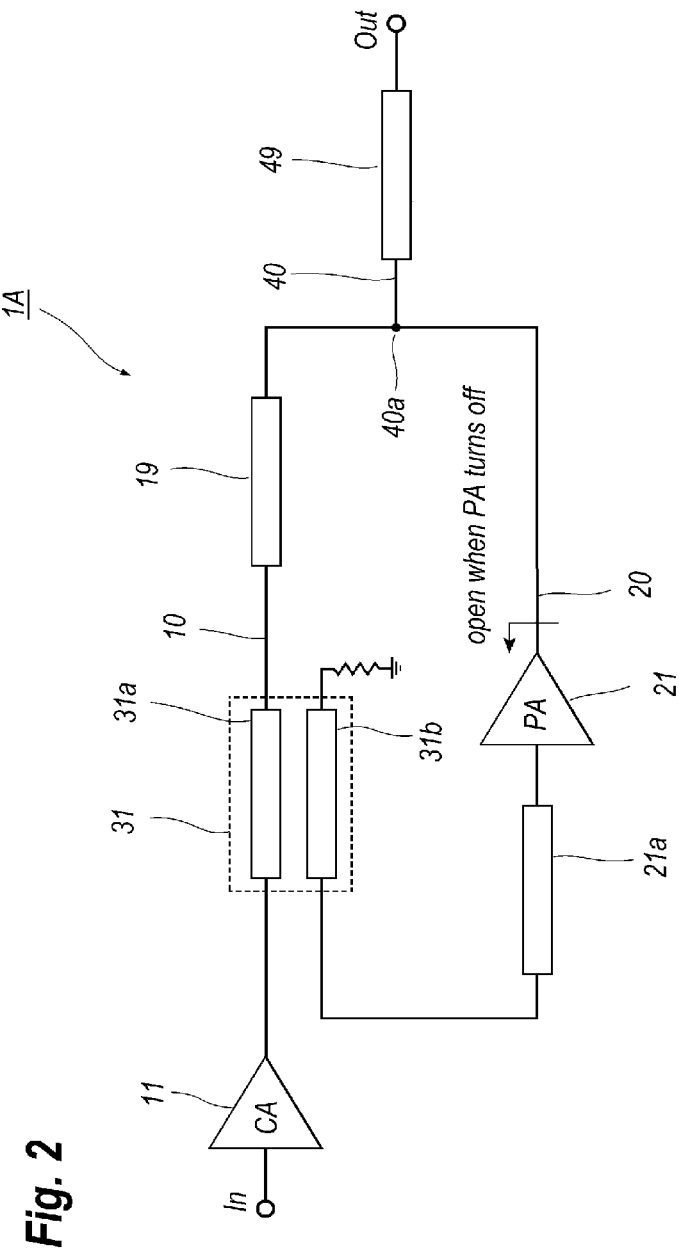
FIG. 2 schematically shows a functional block diagram of a consecutive Doherty amplifier according to an embodiment of the present application.

A Doherty amplifier according to the present invention provides a consecutive arrangement in the CA 11 and the PA 21 each implementing input and output matching circuits therein. FIG. 2 schematically shows a block diagram of the Doherty amplifier 1A according to an embodiment of the present invention. The Doherty amplifier 1A provides no input splitter but includes a directional coupler 31 in the output of the CA 11. The CA 11 is directly coupled with the input terminal In to receive the whole input RF signal. The directional coupler 31 includes two λ/4 transmission lines, 31a and 31b, disposed in parallel with a gap therebetween. One of the λ/4 transmission lines 31a in one end thereof receives the RF signal that is amplifier by the CA 11 and in another end thereof outputs this RF signal, where the another end of the transmission line 31a is often called as a through port. The other λ/4 transmission line 31b in one end thereof, which is often called as an isolation port, is terminated through a resistor; while, the other end, which is often called as a coupling port, outputs another RF signal split from the input RF signal. The gap between two λ/4 lines, 31a and 31b, may adjust a split ratio, that is the coupling coefficient κ between the RF signals output from the through port and the coupling port, respectively. The length of the transmission line 19 may be adjusted to provide the required impedance transformation together with the λ/4 line 31a and an output matching circuit in the CA 11.

The RF signal output from the through port is provided to the path 10, while, the other output from the coupling port is provided to the PA 21 in the path 20 through a phase compensator 21a type of a transmission line. The output of the PA 21 and that of the directional coupler 31, exactly, the through port, are combined in the output path 40 and output from the terminal Out through the impedance converter 49.

The consecutive architecture of a Doherty amplifier 1A shown in FIG. 2 implementing with the directional coupler 31 in the downstream the CA 11 instead of a single λ/4 line 19 shown in FIG. 1 may improve the power gain because only a small amount of the output power of the CA 11, which is determined by the coupling coefficient κ of the directional coupler 31, is used to drive the PA 12. According to the arrangement shown in FIG. 2, reduction in the power gain is determined by the coupling coefficient κ of the directional coupler 31. For example, if the power gain of the CA 11 and the PA 21 both greater than 10 dB, then the coupling coefficient κ of the directional coupler 31 is set to be 10 dB or greater, which results in an increase of the input power required in the consecutive Doherty amplifier 1A just by 1 dB (1.26 times, or 26%) at most, which may be compared with a balanced power amplifier biased in Class AB. This increase is much smaller than the loss in the power gain of 3 dB attributed to the conventional symmetrical Doherty amplifier shown in FIG. 1 implementing 3-dB input splitter. The improvement in the power gain will be even greater for the asymmetrical Doherty arrangement when a significant amount of the input power, that is, a half of the input power, is delivered to the PA amplifier path 20. The series transmission line 21a is connected at the input of the PA 21 for phase compensation between the paths, 10 and 20, for the CA 11 and the PA 21.

Second Embodiment

Figure 3A:
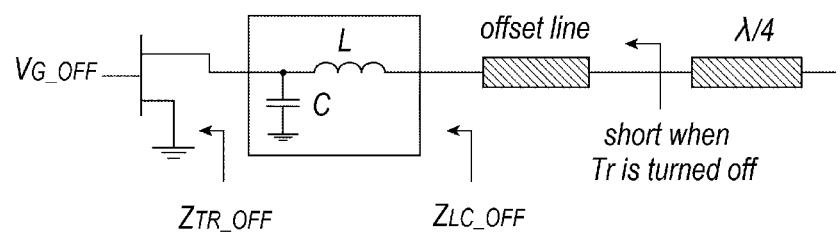
FIG. 3A and FIG. 3B explains a transformation of output impedance of an amplifier implemented in a peak amplifier (PA) in the Doherty amplifier shown in FIG. 2.
Figure 3B:
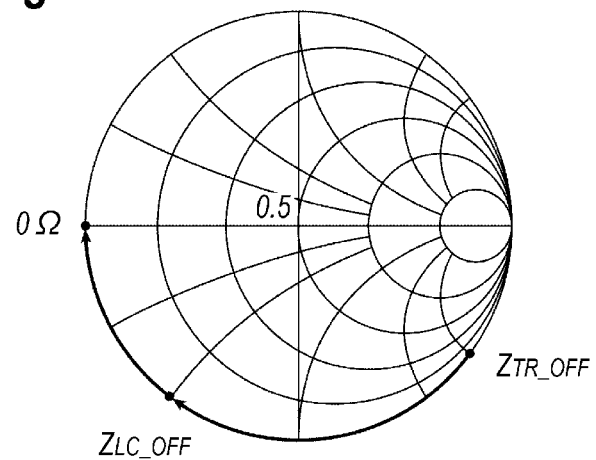

In view of presence of the parasitic components attributed to the devices implemented within the CA 11 and the PA 21, parallel capacitance between current terminals of the device and series inductance attributed to bonding wires and package leads, the output of the PA 21 is preferably designed in the configuration of a short circuit rather an open circuit when the PA 21 is turned off. Under such a condition, shunt capacitance C and series inductance L constitute a series resonant circuit with a resonant frequency close to the carrier frequency of the input RF signal having overall capacitive reactance, as shown in FIG. 3A and FIG. 3B, where FIG. 3A shows a circuit diagram of the PA 21 including the resonant circuit of the capacitance C and the inductance L, and a phase offset line. By adding this phase offset line with relatively short length, namely, shorter than λ/4, as an inductive element at the output of the PA 21, the resonant point may be adequately tuned to the carrier frequency. Further adding a λ/4 line to the end of the offset line, the impedance seen from the added λ/4 line becomes an open circuit.

Figure 4:
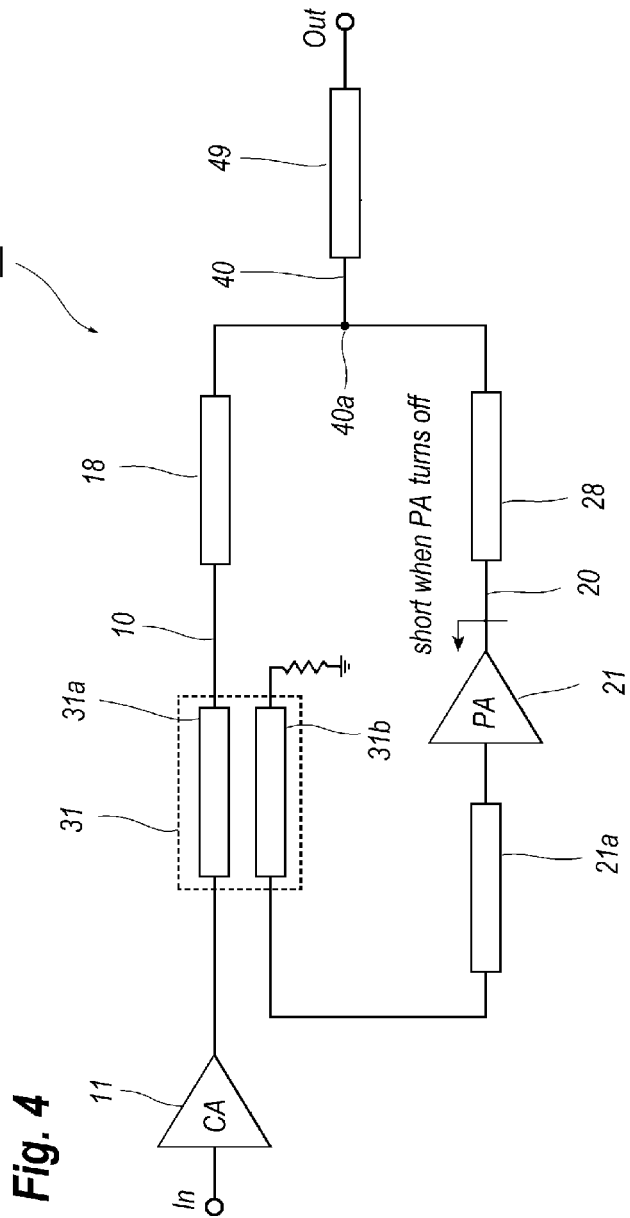
FIG. 4 schematically shows a functional block diagram of a consecutive Doherty amplifier according to the second embodiment of the present application.

FIG. 4 schematically shows a functional block diagram of another consecutive Doherty amplifier 1B modified from the Doherty amplifier 1A shown in FIG. 2, where the modified Doherty amplifier 1B implements an impedance transformer using a λ/4 transmission line 28 in the output of the PA 21. Here, the series transmission line 21a is still provided in the input of the PA 21 for compensating a phase difference between the paths, 10 and 20, for the CA 11 and the PA 21. Also, an additional λ/4 transmission line 18 is required to provide an overall half-wave length to eliminate impedance transformation in the path 10 for the CA 11. In this case, the arrangements in the paths, 10 and 20, for the CA 11 and PA 21, respectively, become identical each other at high output power where the both of the CA 11 and PA 21 turn on, which causes no phase difference and the load impedance seen from each amplifier becomes equal to the standard impedance of 50Ω.

Also, when the PA 21 is turned off at low output power, a λ/4 transmission line 28 provided in the output of the PA 21 is used to transform very low output impedance of the PA 21 to high impedance seen from the combined path 40. At the same time, the output of the CA 11 is connected to the combined path 40 without impedance transformation when it sees 25Ω that results in lower efficiency at lower power levels compared with the conventional Doherty structure using a λ/4 transmission line in the CA path 10 when the CA 11 sees 100Ω. However, impedance can be properly increased by using the internal device output parameters and by implementing the optimized external load-network elements. For a high-power or low-voltage application when the required load impedance for the CA 11 and PA 21 is lower than 50Ω, the more complicated structure for transforming impedance may be used instead of a λ/4 transmission line with the characteristic impedance of 35.3Ω. The embodiment shown in FIG. 4 sets the impedance of the transmission lines, 18 and 28, to be each 50Ω, while, that of the λ/4 transmission line 49 to be 35.3Ω.

Third Embodiment

Figure 5:
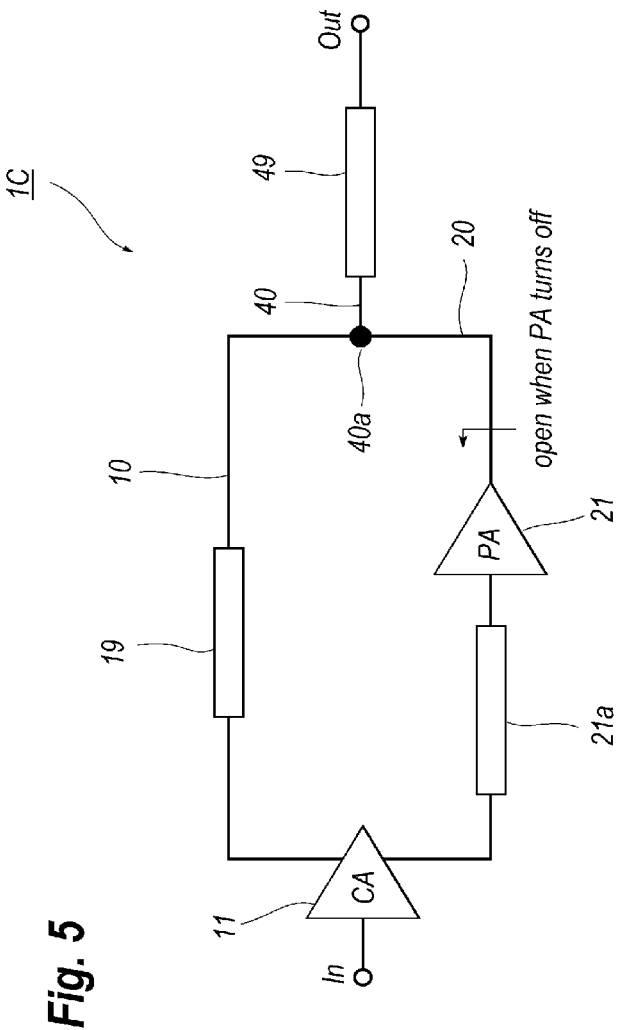
FIG. 5 schematically shows a functional block diagram of a Doherty amplifier according to an embodiment of the present application.

FIG. 5 schematically shows a functional block diagram of the Doherty amplifier 1C according to the third embodiment of the present invention. The Doherty amplifier 1C of the present embodiment with a consecutive configuration where the CA 11 having one input and two outputs provides the function of splitting the input RF signal amplified thereby without using a separate input splitter implemented in the aforementioned CA 11, where the functional block diagram is shown in FIG. 5. Specifically, the CA 11, similar to the aforementioned embodiments, directly receives the input RF signal from the input terminal In and amplifies this input RF signal. The CA 11 of the present embodiment provides two output ports, one of which couples with the combined path 40 through the λ/4 transmission line 19, while, the other is provided to the PA 21 through the phase compensator 21a. The output of the PA 21 directly couples with the combined path 40. The two output of the CA 11 and that of the PA 21 combined in the combined path 40 are outputted from the output terminal Out through the impedance transformer 49 of the λ/4 transmission line.

Such a Doherty amplifier 1C may improve the power gain capability because only a small amount of the output power of the CA 11 is used to drive the PA 21. In the present embodiment, the loss of the power gain is defined by the power split ratio of the CA 11. For example, if the power gain of the CA 11 and that of the PA 21 are greater than 10 dB, then the split ratio at the output of the CA 11 should be 10 times or greater, which results in the required increase in the input power of the consecutive Doherty amplifier 1C compared with the conventional balanced power amplifier biased in Class AB just by 1 dB (1.26 times or 26%) at most. Moreover, this increase in the input power is much lower than the loss in the power gain inevitably attributed to the conventional symmetrical Doherty amplifier with equal-power input splitter, which causes the low of −3 dB. The gain improvement will be even greater for a conventional asymmetrical Doherty structure where a significant amount of the input power is delivered to the PA path. The transmission line connected provided between the split output of the CA 11 and the PA 21 is required for phase compensation between the CA path 10 and the PA path 20.

Figure 6:
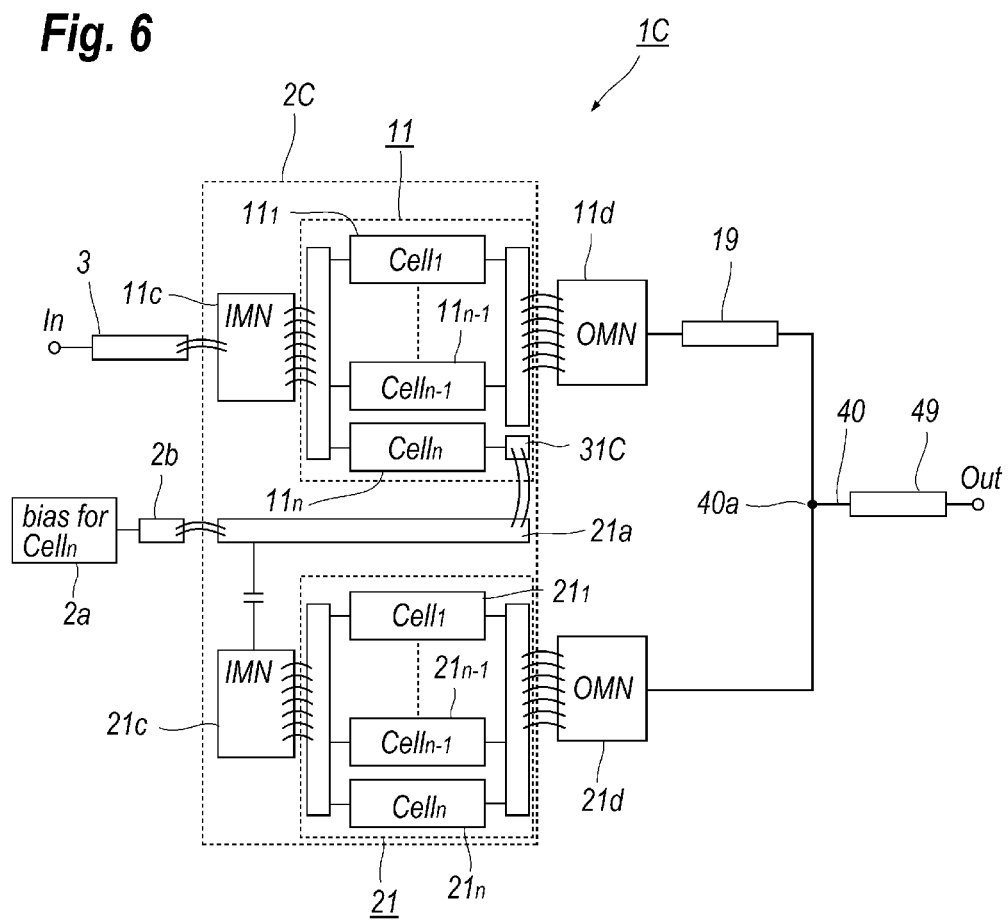
FIG. 6 shows a practical block diagram of the Doherty amplifier shown in FIG. 5.

FIG. 6 shows a practical block diagram of the Doherty amplifier 1C of the present embodiment by the block schematic thereof. The CA 11 and the PA 21 have an arrangement substantially identical each other and may be implemented within a unique multi-chip module 2C. The CA 11 and the PA 21 each include an n-count of cells, $11_1$ to $11_n$, that concurrently receive the input RF signal through a λ/4 transmission line 3 and an input matching unit 11c that matches input impedance of the cells, $11_1$ to $11_n$, with that of the transmission impedance. A portion of the cells, $11_1$ to $11_{n-1}$, couple with the λ/4 transmission line 19 through an output matching unit 11d that matches output impedance of the cells, $11_1$ to $11_{n-1}$, with the transmission impedance, while a rest couples with the phase compensator 21a for the PA 21. Thus, the cells shows a function of a power splitter 31C by distinguish the latter portion from the former portion.

The cells, $21_1$ to $21_n$, in the PA 21 also concurrently receive the input RF signal split by the CA 11 through the phase compensator 21a and another input matching unit (IMN) 21c, amplify thus received RF signal, and output the amplified RF signal to the combining path 40 through an output matching unit 21d. The cells, $11_1$ to $11_n$ and $21_1$ to $21_n$, in the CA 11 and the PA 21 may have an arrangement same with each other. For instance, one transistor within a package may constitute one cell, or, when the cells, $11_1$ to $11_n$, are collectively formed by a plurality of gate fingers as a control terminal, a plurality of source fingers as one of current terminals, and a plurality of drain fingers as another of the current terminals, where each fingers are integrally formed within a signal semiconductor chip; a portion of the drain fingers may constitute the former portion of the cells, $11_1$ to $11_n$, while, a rest portion of the drain fingers may constitute the rest portion of the cells $11_n$. In the CA 11 and the PA 21 shown in FIG. 6, the cells, $11_1$ to $11_n$ and $21_1$ to $21_n$, are supplied with an input bias through the input matching units, 11c and 21c, and an output bias through the output matching units, 11d and 21d, except for the split output 31C. The split output 31C may be biased from the bias source 2a through a transmission line 2b and the phase compensator 21a.

In FIG. 6, the CA 11, the PA 21, the phase compensator 21a and the input matching units, 11c and 12c, are integrally implemented within a unique multi-chip module 2C. However, the multi-chip module 2C may exclude the input matching units, 11c and 12c, and/or the phase compensator 21a; or may include the output matching units, 11d and 21d. The integration in the multi-chip module 2C may be optional. Also, the split ratio may be also optional by adjusting a count of the cells coupled with the λ/4 transmission line 19 among the n-count of cells.

The input λ/4 transmission line 3 is required to match the input impedance of the multi-chip module 2C. Also, the λ/4 transmission line 19 is required for transforming the output impedance of the CA 11. In the arrangement shown in FIG. 6, at high power level where both of the CA 11 and the PA 21 operate with matched phase difference therebetween; the load impedance seen from the CA 11 and also the PA 21 becomes equal to the standard load impedance of 50Ω. While, at low power levels where only the CA 11 operates but the PA 21 turns off to show an open circuit seen from the combining path 40, the λ/4 transmission line 19 may be used to transform impedance of 25Ω obtained at the combining node to high impedance of 100Ω seen by the CA 21.

For a high power or low voltage application when the required load impedance for the CA 11 and the PA 21 is lower than 50Ω, the more complicated impedance-transforming arrangement may be used instead of the λ/4 transmission line 49 with the characteristic impedance of 35.3Ω in the present embodiment. Different combinations of the characteristic impedance of the λ/4 transmission lines, 19 and 49, in the load network, where the present embodiment sets the impedance of 50 and 35.5Ω, respectively, may be used for the asymmetric operation of the consecutively integrated Doherty amplifier 1C when the count of the cells in the PA 21 is set to be greater than that in the CA 11.

Fourth Embodiment

Figure 7:
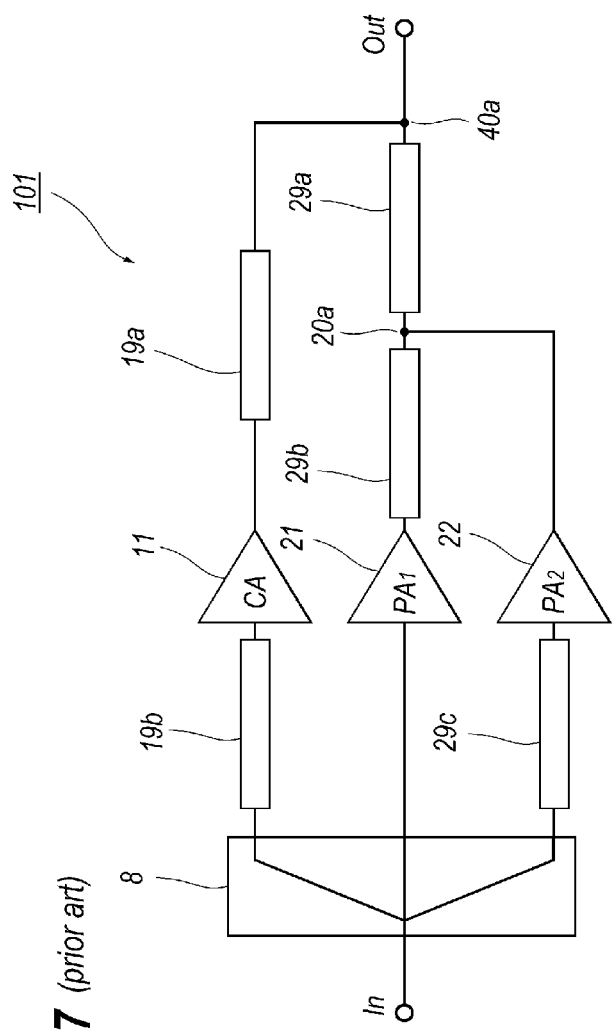
FIG. 7 schematically shows the block diagram of a three-stage Doherty amplifier.

The fourth embodiment according to the present invention relates to a multi-stage Doherty amplifier. In advance to explain the embodiments of the present invention, a conventional multi-stage Doherty amplifier and disadvantages thereof will be described. FIG. 7 schematically shows the block diagram of a three-stage Doherty amplifier 101, which is conventionally known in the field and has a ratio in the device size of 1:1:1. The 3-stage Doherty amplifier 101 comprises one CA 11 and two PAs, 21 and 22. In the arrangement shown in FIG. 7, all amplifiers, 11 to 22, are turned on at saturation to provide maximum efficiency at maximum output power (first efficiency peak), the CA 11 and only the first PA 21 are turned on with the second PA 22 being turned off to provide efficiency peak at the power smaller than the maximum output power by 6 dB (second efficiency peak), and only the CA 11 is turned on, that is, two PAs, 21 and 22, are turned off to provide maximum back-off efficiency peak at output power smaller than the maximum output power by 9.5 dB (third efficiency peak) when the Doherty amplifier 101 in the output thereof sees a load of 150Ω.

Figure 8:
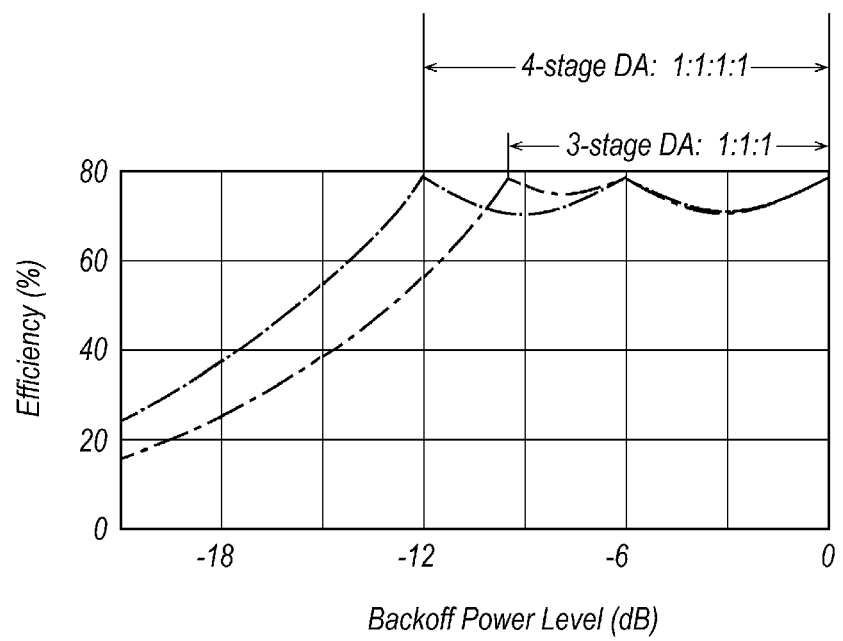
FIG. 8 exemplarily shows behaviors of the efficiency of 3-stage and 4-stage Doherty amplifiers against the output power measured relatively to the maximum output power thereof.

FIG. 8 exemplarily shows behaviors of the efficiency of 3-stage and 4-stage Doherty amplifier against the output power measured relatively to the maximum output power thereof, where the Doherty amplifiers implement equal sized devices in the respective amplifiers. All amplifiers include the input and output matching circuits, whose configurations fully depend on the corresponding device impedance for particular applications to match source impedance with the load impedance of 50Ω.

Referring to FIG. 7 again, the output combiner in a conventional arrangement includes a transmission line 19a with a length of 3λ/4 and impedance of 86.7Ω between the output terminal Out and the CA 11 to show the impedance transformation when high impedance of 150Ω is seen at the output of the CA 11; a transmission line 29a between a node 20a and the output terminal Out with a length of λ/4 and the characteristic impedance of 43.3Ω; and a transmission line 29b between the output of the first PA 21 and the node 20a with a length of λ/4 and the impedance of 50Ω. Two additional λ/4 transmission lines, 19b and 29c, are provided between the three-way input splitter 8 and the respective inputs of the CA 11 and the second PA 22 to compensate for the phase differences caused by the output combiner.

The conventional three-stage Doherty amplifier shown in FIG. 7 has a significant disadvantage when its power gain drops by 3 times (or 4.8 dB) at lower power levels when the first PA 21 and the second PA 22 are turned off. This is because only one third of input power is continuously provided to the CA 11 by the three-way equal-power input splitter 8.

Figure 9:
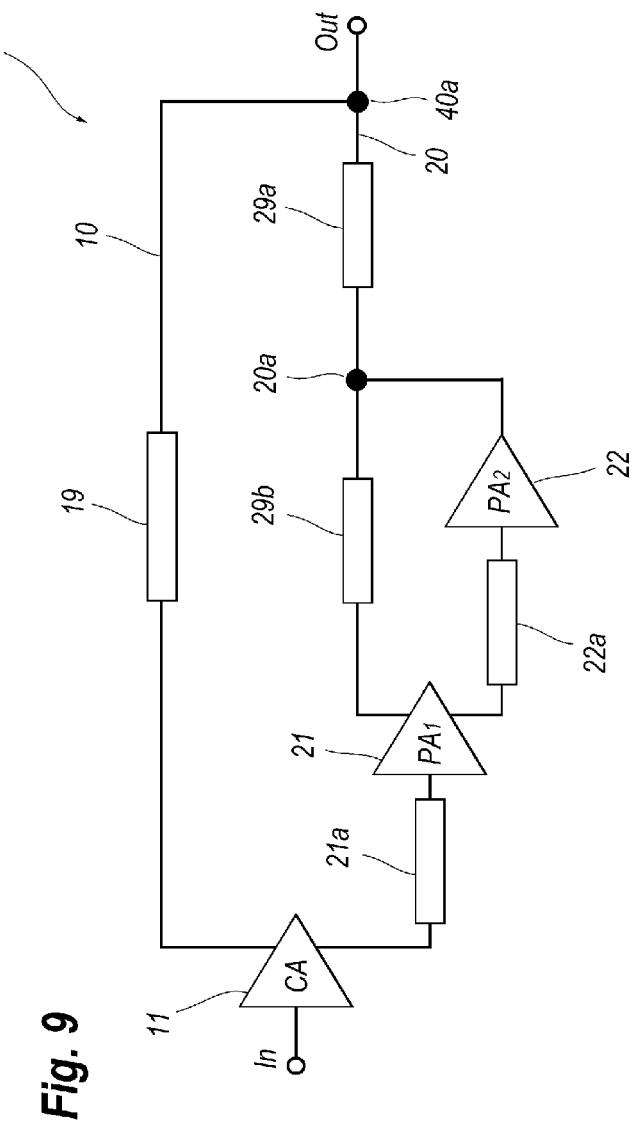
FIG. 9 schematically shows a functional block diagram of a 3-stage Doherty amplifier according to the fourth embodiment of the present application.

FIG. 9 schematically shows a functional block diagram of a 3-stage Doherty amplifier according to the fourth embodiment of the present invention. The Doherty amplifier 1D includes a CA 11 and two PAs, 21 and 22, where the CA 11 and the first PA 21 have the arrangement same with each other and with the CA 11 in the former embodiment shown in FIG. 6, while, the second PA 22 has an arrangement same with the arrangement of the first PA 21 also in the former embodiment. The CA 11, and two PAs, 21 and 22, may implement the input matching units and the output matching units similar to those in the former embodiment. Specifically, the CA 11 and the first PA 21 have two outputs, one of which in the CA 11 is coupled with the input of the first PA 21 through the phase compensator 21a; and one of the outputs of the first PA 21 is coupled with the second PA 22 through another phase compensator 22a. The other output of the CA 11, that of the first PA 21, and the output of the second PA 22 are coupled with the combining node 40a through an output combiner.

The CA 11 and the two PAs, 21 and 22, are configured to operate such that the PAs, 21 and 22, turn on sequentially as an increase of the input power. The CA 11 directly couples with the output terminal Out through a transmission line with a length of 3λ/4 in the CA path 10; the first PA 21 couples with the node 20a common to the second PA 22 through a transmission line with a length of λ/4; the second PA 22 couples with the node 20a; and the this node 20a couples with the combining node 40a through a transmission line 29a with a length of λ/4 and impedance of 43.3Ω. Two λ/4 transmission lines, 29a and 29b, connected to the combining node 40a set the impedance of the PAs, 21 and 22, seen from the output terminal Out to be an open circuit when the PAs, 21 and 22, turn off. The impedance of the transmission lines is chosen according to provide power combining when the CA 11 and the PAs, 21 and 22, turn on.

The three-stage Doherty amplifier 1D provides an architecture using consecutive configuration shown in FIG. 9, where the CA 11 and the first PA 21 having one input and two outputs provides implements a function of the power splitting, without using a separate three-way input splitter; accordingly, the Doherty amplifier 1D significantly improves the power gain capability because only a small amount of the output power of the CA 11 is used to drive the first PA 21. In this case, the loss in the power gain may be defined by the power splitting ratio of the CA 11. For example, when the power gain of both the CA 11 and that of the first PA 21 are greater than 10 dB, then the power splitting ratio at the output of the CA 11 should be 10 times or greater, which results in the increase in the input power of the consecutive three-stage Doherty amplifier becomes 1 dB (1.26 time) at most compared with the power amplifier having an arrangement of three parallel equal-power stages all biased in Class AB.

Also, this increase in the input power is much lower than the power gain loss of 4.8 dB of the conventional three-stage Doherty amplifier shown in FIG. 7 with equal-power three-way input splitter 8. In the arrangement of the present Doherty amplifier 1D shown in FIG. 9, the splitting ratio of the output power is set equal for the CA 11 and the first PA 21. The improvement in the power gain will be even greater compared with an asymmetrical Doherty amplifier having a diagram shown in FIG. 7. In such an arrangement, a significant amount of the input power is necessary to be delivered to the first PA 21 and the second PA 22. Here, the electrical length of the series impedance-transforming transmission line at the CA output is equal to 270° (or physical length of 3λ/4). The series transmission line provided at the input of the CA 11 and the second PA 22 are required for entire phase compensation between the three amplifiers, CA 11 and the PAs, 21 and 22.

Figure 10:
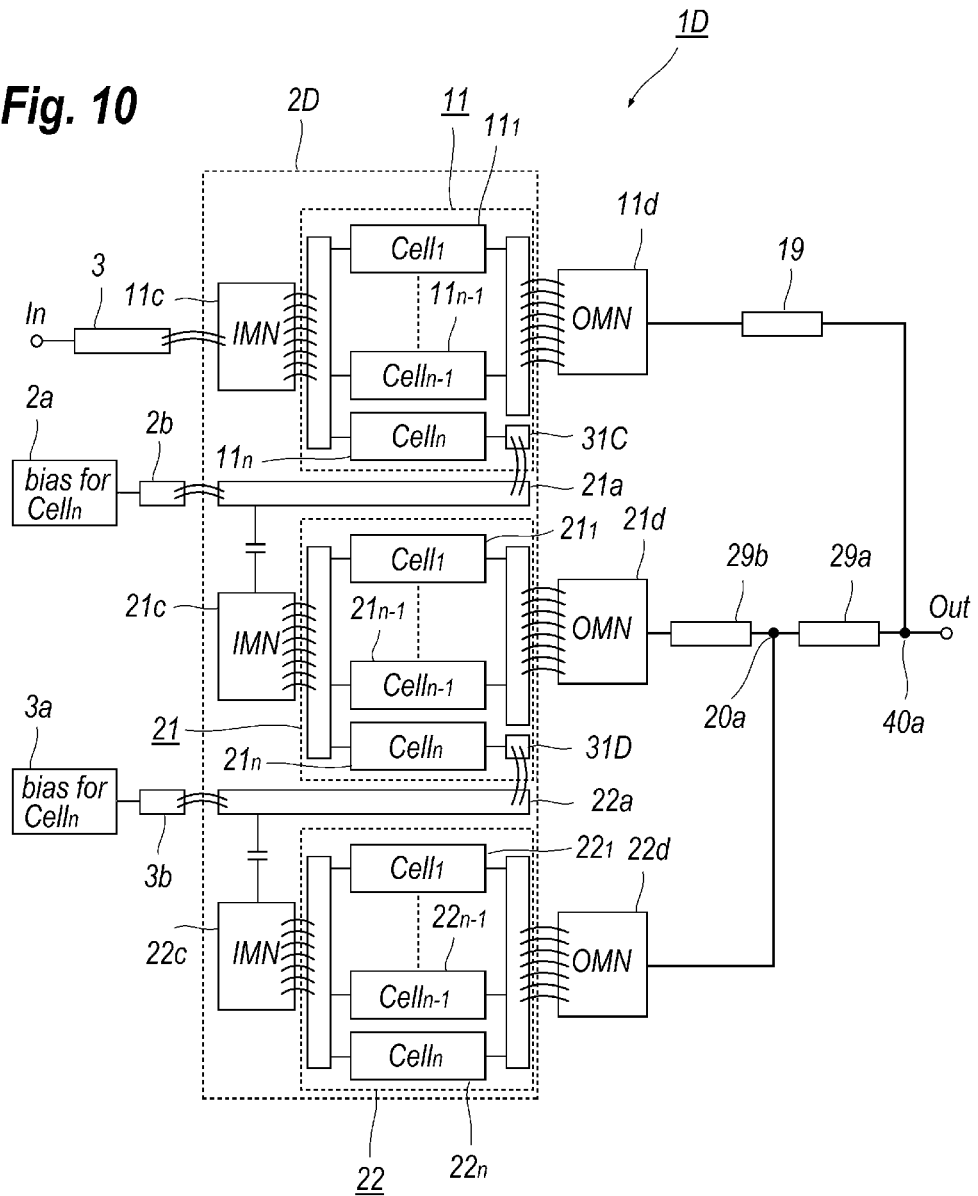
FIG. 10 shows the practical block diagram of the three-stage consecutive Doherty amplifier shown in FIG. 9.

FIG. 10 shows the practical block diagram of the three-stage consecutive Doherty amplifier 1D. As shown in FIG. 10, the CA 11 and the first PA 21 have the arrangement same with each other, while, the second PA 22 has an arrangement substantially equal to the arrangement of the CA 11 and the first PA 21 except for the second PA 22 removes the output splitter. That is, all amplifiers, 11, 21 and 22, includes an n-count of cells, $11_1$ to $11_n$, each collectively receive an input signal from an upstream unit through an input matching unit 11c. However, the cells, $11_1$ to $11_n$, in the second PA 22 collectively provide an amplified signal through an output matching unit 22d, while, the cells, $11_1$ to $11_n$, in a portion thereof provide an amplifier signal through the output matching units, 11d and 21d, ant in a rest portion thereof output the split signal to a downstream unit through the respective phase compensators, 21a and 22a. Thus, the CA 11, the first PA 21, and the second PA 22 may constitute a consecutive path from the input terminal In to the combining node 40a.

Same with the aforementioned embodiment shown in FIG. 6, the cells, $11_1$ to $11_n$, in the CA 11 and the cells, $21_1$ to $21_n$, in the first PA 21, may have an arrangement same with each other. For instance, one transistor within a package may constitute one cell, or, when the cells are collectively formed by a plurality gate fingers as a control terminal, a plurality of source fingers as one of current terminals, and a plurality of drain fingers as another of the current terminals, where each fingers are integrally formed within a signal semiconductor chip; a portion of the drain fingers may constitute the former portion of the cells, while, a rest portion of the drain fingers may constitute the rest portion of the cells. In the amplifiers, 11, 21, and 22, shown in FIG. 10, the cells are supplied with input biases through the input matching units, 11c to 22c, while, output biases through the output matching units, 11d to 22d, except for the split outputs, 31C and 31D. The split outputs, 31C and 31D, may be biased from the bias sources, 2a and 3a, through the transmission lines, 2b and 3b, and the phase compensators, 21a and 22a.

The consecutive Doherty amplifier 1D may integrate three amplifiers, 11, 21, and 22, within a unique multi-chip module 2D, where the multi-chip module may further integrate the input matching units, 11c to 22c, the output matching units, 11d to 22d, and the phase compensates, 21a and 22a. Thus, the integration of the respective elements within the multi-chip module is optional. Also, the count of the cells among the total cells, $11_1$ to $11_n$ and $21_1$ to $21_n$, which may determine the power splitting ration, is optional.

The output combiner including the 3λ/4 transmission line 19 and two λ/4 transmission lines, 29a and 29b, has an arrangement and a function same with the output combiner shown in FIG. 9. That is, the 3λ/4 transmission line 19 transforms the output impedance of the CA 11 so as to match the load impedance of 50Ω, where the 3λ/4 transmission line 19 provides the characteristic impedance of 86.7Ω in the present embodiment. The λ/4 t transmission line 29b provided between the first PA 21 and the combining node 20a, and the other λ/4 transmission line 29a provided between the nodes, 20a and 40a, with the impedance of 43.3Ω transforms the output impedance of the first PA 21 to the load impedance of 50Ω.

In this case, at high power with matched phase difference between the paths for the CA 11, the first PA 21 and the second PA 22, the load impedance seen from the respective amplifiers, 11, 21, and 22, becomes equal to the standard load impedance of 50Ω. At low power where the first and second PAs, 21 and 22, are turned off, the 3λ/4 transmission line 19 in the CA path 10 is used to transform the load impedance of 50Ω to high impedance of 150Ω seen from the CA 11. For a high power or low voltage application when the required load impedance for the CA 11 and the first and second PAs, 21 and 22, is lower than 50Ω, the more complicated impedance-transforming structure in the output combiner may be used. Besides, different combination of the characteristic impedances of the 3λ/4 and λ/4 transmission lines in the output combiner may be used for the asymmetric operation of the three-stage consecutive Doherty amplifier when the number of cells in the first and second PAs, 21 and 22, is greater than that in the CA 11.

Fifth Embodiment

Figure 11:
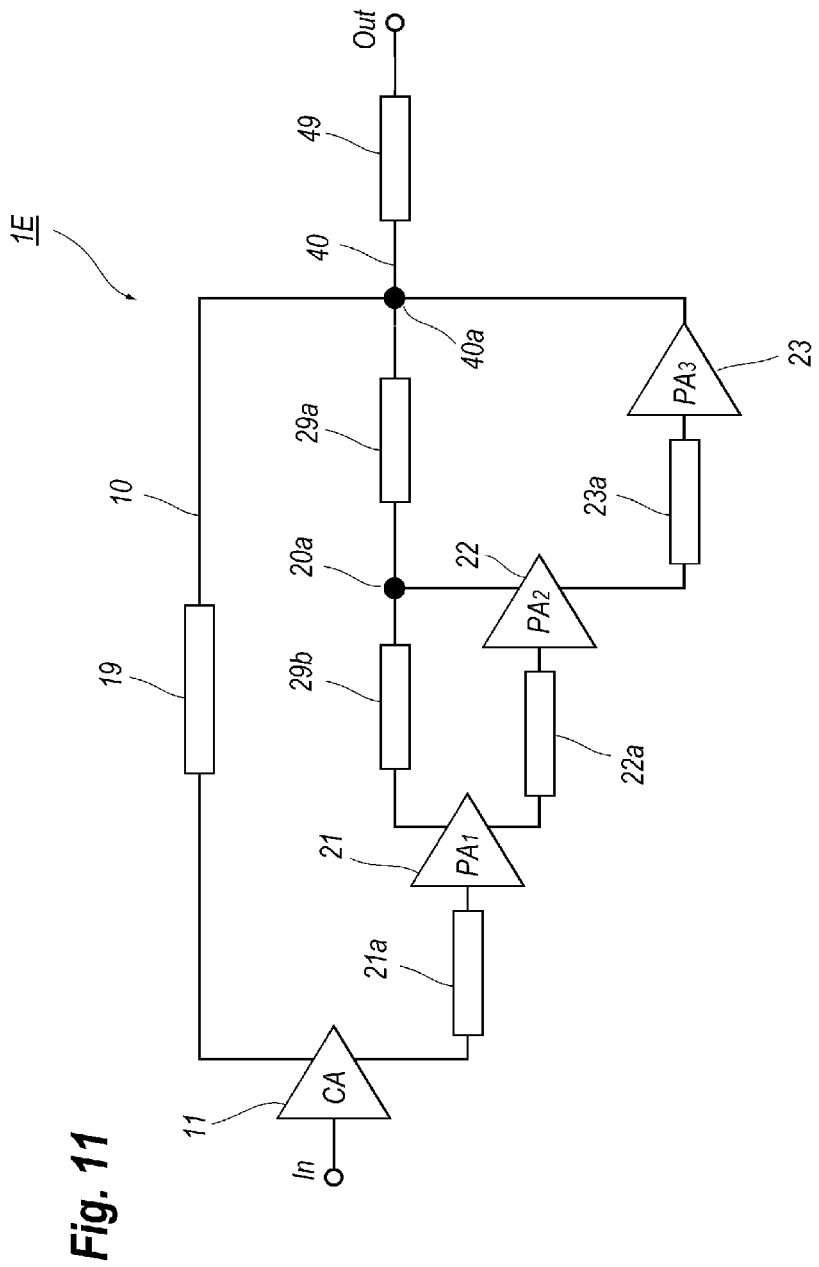
FIG. 11 schematically shows the block diagram of the four-stage Doherty amplifier having the consecutive configuration.
Figure 12:
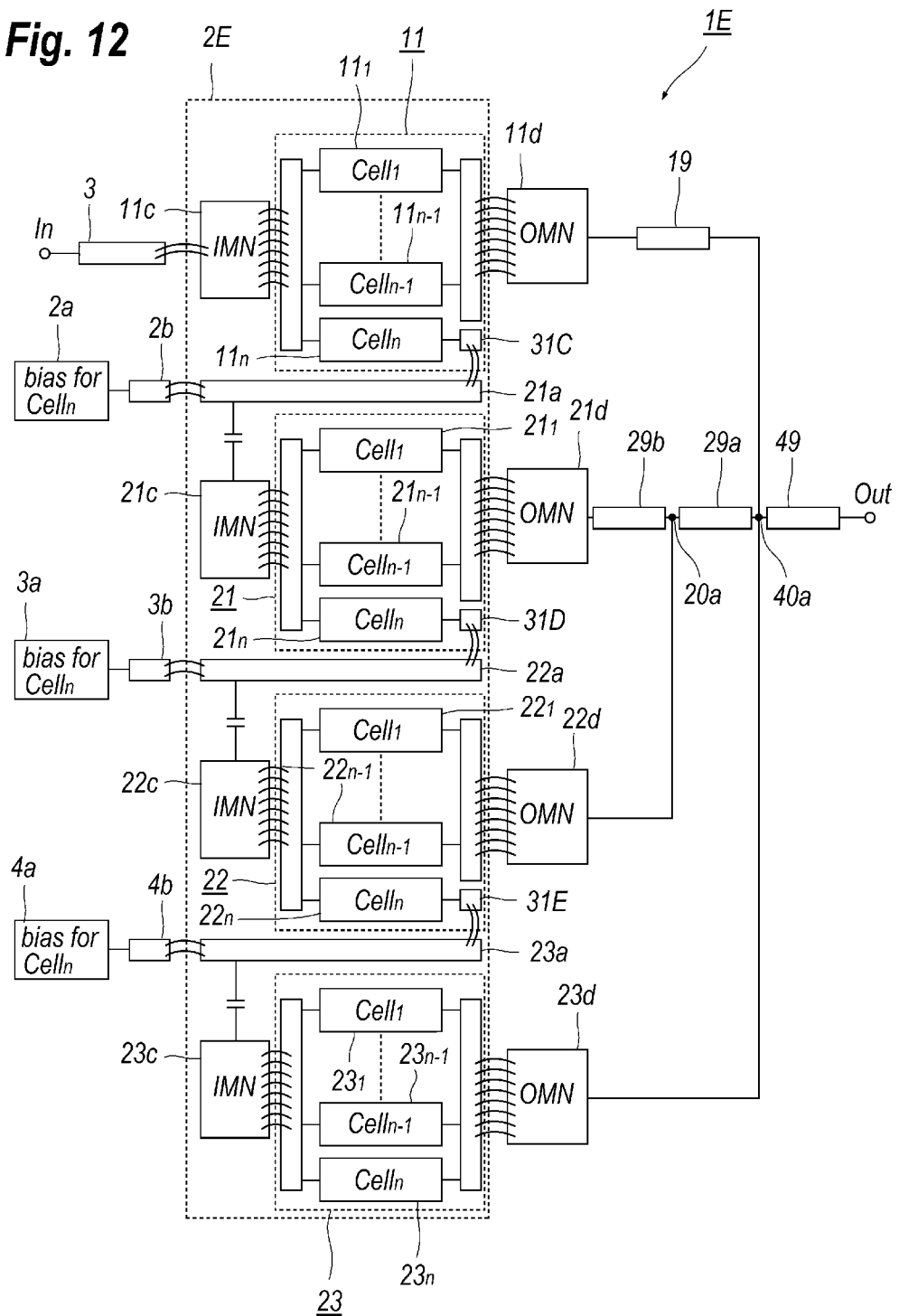
FIG. 12 shows the practical block diagram of the consecutive four-stage Doherty amplifier shown in FIG. 11.

FIG. 11 schematically shows the block diagram of the four-stage Doherty amplifier 1E having the consecutive configuration whose practical block diagram is shown in FIG. 12. The Doherty amplifier 1E of the present embodiment, same with the aforementioned embodiments, provides no four-way input splitter that evenly splits the input RF signal to the CA 11 and the first to third PAs, 21 to 23. Accordingly, the Doherty amplifier 1E shown in FIG. 11 and FIG. 12 may significantly improve not only the efficiency profile over wide range of the back-off output power but especially the power gain capability because only a small amount of the output power of the CA 11 is used to drive the first PA 21. The loss in the power gain, which may be defined by the power splitting ratio in the CA 21, in other words, the increase in the input power of the four-stage consecutive Doherty amplifier 1E of the invention, where the CA 11, and the PAs, 21 and 22 are set in the output power splitting ratio equal to each other, becomes just 1 dB (1.26 times) at most, which is comparable to a case of a power amplifier with an arrangement of four parallel and equal-power stages all biased in class AB. The improvement in the gain thereof will be even greater for the conventional asymmetrical Doherty structure when a significant amount of the input power is necessary to be delivered to all PAs, 21 to 23.

Referring to FIG. 11, the path 10 for the CA 11 provides the transmission line 19 with a length of 3λ/4 and the impedance of 50Ω. Two transmission lines, 29a and 29b, in the path 20 compensate the entire phase between the paths for the CA 11 and the first to third PAs, 21 to 23. In a standard 50Ω system where the signal source impedance and the load impedance are set to be 50Ω. Two λ/4 transmission lines, 29a and 29b, in the path 20 have the impedance of 25Ω and 50Ω, respectively.

FIG. 12 shows the practical block diagram of the four-stage consecutive Doherty amplifier shown in FIG. 11. In the arrangement shown in FIG. 12, a multi-chip module 2E integrates four amplifiers, 11 to 23. The multi-chip module 2E may further integrate the input matching units, 11c to 23c, and the phase compensators, 21a to 23a. Similar to the consecutive Doherty amplifier 1D shown in FIG. 10, the integration of the elements within the multi-chip module may be optional.

The CA 11 and the first and second PAs, 21 and 22, each have a plurality of the cells, $11_1$ to $11_n$, $21_1$ to $21_n$, and $22_1$ to $22_n$, where respective portions and respective rest portions thereof form output power splitters. The respective former portions of the cells couple with the combining node 40a through the output combiner, while, the respective rest portions couple with the downstream PAs, 21 to 23, through the phase compensators, 21a to 23a. The last PA 23 also includes a plurality of cells, $23_1$ to $23_n$, all of which couple with the combining node 40a through the output combiner.

The output combiner reflects the arrangement shown in FIG. 11. That is, the 3λ/4 transmission line 19 with the impedance of 50Ω transforms the output impedance of the CA 11 to the load impedance. Two transmission lines, 29a and 29b, each having the length of λ/4 but the impedance of 25Ω and 50Ω, respectively, transforms the output impedance of the PA 21 and the PA 22 to the load impedance. Also, the last λ/4 transmission line in the combining path 40 also transforms the impedance of the output combiner to the load impedance of 50Ω.

Thus, the load impedance seen from the respective amplifiers, 11 and 21 to 23, when all amplifiers, 11 and 21 to 23, turn on at high power with matched phase difference therebetween, becomes equal to the standard load impedance of 50Ω. While, at low power where all PAs, 21 to 23, are turned off, the 3λ/4 transmission line 19 in the path 10 is used to transform the load impedance of 50Ω to high impedance of 200Ω seen by the CA 11. For a high power or low voltage application where the required load impedance for all amplifiers, 11 and 21 to 23, is smaller than 50Ω, the more complicated impedance-transforming structure in the output combiner may be used.

While several embodiments and variations of the present invention are described in detail herein, it should be apparent that the disclosure and teachings of the present invention will suggest many alternative designs to those skilled in the art.

What is claimed is:

1. A consecutive Doherty amplifier that outputs an amplified signal by receiving an input radio frequency (RF) signal, the consecutive Doherty amplifier comprising:
   an input terminal that receives the input RF signal thereto;
   a carrier amplifier that receives the input RF signal provided in the input terminal without interposing any signal splitters;
   a power splitter that splits a signal output from the carrier amplifier into a first split signal and a second split signal;
   a peak amplifier that receives the second split signal; and
   a phase compensator provided between the power splitter and the peak amplifier, the phase compensator compensating a phase difference between the first split signal output from the power splitter and a signal output from the peak amplifier;
   wherein the consecutive Doherty amplifier outputs the first split signal when the peak amplifier turns off, and the first split signal combined with the signal output from the peak amplifier when the peak amplifier turns on,
   wherein the carrier amplifier integrates the power splitter therein,
   wherein the carrier amplifier includes a plurality of cells each concurrently receiving the input RF signal,
   wherein the cells in a portion thereof outputs the first split signal and in a rest portion thereof outputs the second split signal, and
   wherein the cells collectively have a function of the power splitter.

2. The consecutive Doherty amplifier according to claim 1,
   wherein the power splitter is a directional coupler having a through port that outputs the first split signal, a coupling port that outputs the second split signal and an isolation port that is terminated to a ground.

3. The consecutive Doherty amplifier according to claim 2,
   wherein the directional coupler provides a pair of transmission lines extending parallel to each other, and
   wherein the directional coupler sets a split ratio of the first split signal against the second split signal by a gap between the transmission lines.

4. The consecutive Doherty amplifier according to claim 2,
   further including a transmission line and another transmission line each having a quarter wavelength (λ/4), where λ, is a wavelength of the input RF signal, the transmission line being provided in an input of the peak amplifier, the another transmission line being provided in the through port of the power splitter.

5. The consecutive Doherty amplifier according to claim 1,
   where the cells involved in the portion against the cells involved in the rest portion determine a split ratio of the power splitter.

6. The consecutive Doherty amplifier according to claim 1,
   wherein the carrier amplifier further includes the phase compensator therein, the phase compensator receiving outputs of the rest portion of the cells as the second split signal.

7. The consecutive Doherty amplifier according to claim 6,
   wherein the peak amplifier includes a plurality of cells each coupling with the phase compensator and collectively outputting the signal.

8. The consecutive Doherty amplifier according to claim 7,
   wherein the cells in the carrier amplifier, the phase compensator, and the cells in the peak amplifier are assembled in a unique multi-chip module.

9. A consecutive Doherty amplifier that outputs an amplified signal by receiving an input radio frequency (RF) signal, the consecutive Doherty amplifier comprising:
   an input terminal that receives the input RF signal thereto;
   a carrier amplifier that receives the input RF signal provided in the input terminal without interposing any signal splitters;
   a power splitter that splits a signal output from the carrier amplifier into a first split signal and a second split signal;
   a peak amplifier that receives the second split signal;
   a phase compensator provided between the power splitter and the peak amplifier, the phase compensator compensating a phase difference between the first split signal output from the power splitter and a signal output from the peak amplifier; and
   another power splitter and another phase compensator;
   wherein the consecutive Doherty amplifier outputs the first split signal when the peak amplifier turns off, and the first split signal combined with the signal output from the peak amplifier when the peak amplifier turns on,
   wherein the carrier amplifier integrates the power splitter therein,
   wherein the peak amplifier includes a first peak amplifier and a second peak amplifier,
   the first peak amplifier outputting a first amplified signal by receiving the second split signal through the phase compensator,
   the another power splitter splitting a signal output from the first peak amplifier into a third split signal and a fourth split signal,
   the another phase compensator being provided between the another power splitter and the second peak amplifier,
   the second peak amplifier outputting the signal by receiving the fourth split signal through the another phase compensator, and
   wherein the signal output from the second peak amplifier is combined with the third split signal that is provided through a first transmission line with a length of 3λ/4, where λ, is a wavelength of the input RF signal,
   wherein the first split signal coming from the power splitter through a second transmission line with a length of λ/4 is combined with a signal provided through a third transmission line with a length of λ/4, the signal combining the third split signal output from the another power splitter with the signal output from the second peak amplifier, and outputted as the amplified signal at the output terminals.

10. The consecutive Doherty amplifier according to claim 9,
wherein the carrier amplifier includes a plurality of cells each concurrently receiving the input RF signal, the cells in a portion thereof outputting the first split signal and in a rest portion thereof outputting the second split signal, and
wherein the cells collectively has a function of the power splitter.

11. The consecutive Doherty amplifier according to claim 10,
where the cells involved in the portion thereof against the cells involved in the rest portion thereof determine a split ratio of the power splitter.

12. The consecutive Doherty amplifier according to claim 10,
wherein the carrier amplifier further includes the phase compensator therein, the phase compensator receiving outputs of the rest portion of the cells as the second split signal.

13. The consecutive Doherty amplifier according to claim 10,
wherein the first peak amplifier includes a plurality of cells each concurrently receiving the signal output from the phase compensator, the cells in a portion thereof outputting the third split signal and in a rest portion thereof outputting the fourth split signal, and
wherein the cells in the first peak amplifier collectively have a function of the another power splitter.

14. The consecutive Doherty amplifier according to claim 13,
where the cells involved in the portion in the first peak amplifier against the cells involved in the rest portion in the first peak amplifier determine a split ratio of the another power splitter.

15. The consecutive Doherty amplifier according to claim 14,
wherein the first peak amplifier further includes the another phase compensator therein, the another phase compensator receiving an output of the rest portion of the cells in the first peak amplifier as the fourth split signal.

16. The consecutive Doherty amplifier according to claim 15,
wherein the second peak amplifier includes a plurality of cells each coupling with the another phase compensator and collectively outputting a signal to the second transmission line.

17. The consecutive Doherty amplifier according to claim 16,
wherein the cells in the carrier amplifier, the phase compensator, the cells in the first peak amplifier, the another phase compensator, and the cells in the second peak amplifier are assembled in a unique multi-chip module.

18. A consecutive Doherty amplifier that outputs an amplified signal by receiving an input radio frequency (RF) signal, the consecutive Doherty amplifier comprising:
an input terminal that receives the input RF signal thereto;
a carrier amplifier that receives the input RF signal provided in the input terminal without interposing any signal splitters;
a power splitter that splits a signal output from the carrier amplifier into a first split signal and a second split signal;
a peak amplifier that receives the second split signal;
a phase compensator provided between the power splitter and the peak amplifier, the phase compensator compensating a phase difference between the first split signal output from the power splitter and a signal output from the peak amplifier; and
a transmission line and another transmission line;
wherein the consecutive Doherty amplifier outputs the first split signal when the peak amplifier turns off, and the first split signal combined with the signal output from the peak amplifier when the peak amplifier turns on,
wherein the power splitter is a directional coupler having a through port that outputs the first split signal, a coupling port that outputs the second split signal and an isolation port that is terminated to a ground,
wherein the another transmission line connecting to the through port of the directional coupler, and
wherein the transmission line and another transmission line each having a quarter wavelength (λ/4), where λ, is a wavelength of the input RF signal, the transmission line being provided in an input of the peak amplifier, the another transmission line being provided in the through port of the power splitter.

* * * * *